United States Patent
Yamamoto et al.

(10) Patent No.: US 7,800,396 B2
(45) Date of Patent: Sep. 21, 2010

(54) SEMICONDUCTOR INTEGRATED CIRCUIT, CONTROL METHOD, AND INFORMATION PROCESSING APPARATUS

(75) Inventors: Takashi Yamamoto, Kawasaki (JP); Takaharu Ishizuka, Kawasaki (JP); Toshikazu Ueki, Kawasaki (JP); Takeshi Owaki, Kawasaki (JP); Atsushi Morosawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/475,480

(22) Filed: May 30, 2009

(65) Prior Publication Data
US 2009/0300410 A1    Dec. 3, 2009

(30) Foreign Application Priority Data
May 30, 2008  (JP)  ............................... 2008-142072

(51) Int. Cl.
*H03K 19/003* (2006.01)
(52) U.S. Cl. ................................. 326/9; 326/14; 326/16
(58) Field of Classification Search ........................ None
See application file for complete search history.

(56) References Cited

U.S. PATENT DOCUMENTS

| 6,823,293 | B2 | 11/2004 | Chen et al. |
| 7,116,114 | B2 | 10/2006 | Kajita |
| 7,359,811 | B1* | 4/2008 | Liu ............................ 702/69 |
| 7,688,098 | B2* | 3/2010 | Kajita ........................ 324/763 |
| 7,734,433 | B2* | 6/2010 | Konmoto ..................... 702/64 |

FOREIGN PATENT DOCUMENTS

| JP | 2004-212387 A | 7/2004 |
| JP | 2005-249408 A | 9/2005 |

* cited by examiner

*Primary Examiner*—Anh Q Tran
(74) *Attorney, Agent, or Firm*—Fujitsu Patent Center (57) ABSTRACT

A semiconductor integrated circuit includes a circuit block connected to an arithmetic processing unit via a bus, a power supply noise data generator which is configured to generate a power supply noise data signal by converting power supply noise generated in power supply voltage of power supply operates the circuit block, an error detector which is configured to detect an error of data outputted from the circuit block to the bus, and a write controller which is configured to associate power supply noise information based on the power supply noise data signal with data on the bus and write the data in a storage unit, and to stop to write the data in response to the detection of the error by the error detector.

10 Claims, 9 Drawing Sheets

SEMICONDUCTOR INTEGRATED CIRCUIT, CONTROL METHOD, AND INFORMATION PROCESSING APPARATUS

CROSS-REFERENCE TO RELATED APPLICATIONS

This application is based upon and claims priority to prior Japanese Patent Application No. 2008-142072 filed on May 30, 2008 in the Japan Patent Office, the entire contents of which are incorporated herein by reference.

FIELD

The present invention relates to a semiconductor integrated circuit, a control method, and an information processing apparatus for error analysis in the semiconductor integrated circuit.

BACKGROUND

In recent years, as manufacturing process of a semiconductor integrated circuit is minimized, power supply noise increasingly affects operation of the semiconductor integrated circuit, for example, erroneous operation due to an effect of power supply noise on a minimized circuit wiring. In order to cope with the power supply noise, first, it is preferable to accurately observe the power supply noise that causes the malfunction.

As the observation method of the power supply noise, a method to connect an oscilloscope to a semiconductor integrated circuit or an electronic board that mounts the semiconductor integrated circuit via a probe and perform observation is disclosed. Such a method of connecting the oscilloscope to the outside of the semiconductor integrated circuit and perform the observation has the following drawback. For example, it is difficult to observe high frequency power supply noise generated in a semiconductor integrated circuit such as a central processing unit (CPU), which has an arithmetic processing unit that operates at a high speed, or a chip set that operates with the CPU at a high speed from the outside of the semiconductor integrated circuit. That is, the high frequency power supply noise is not only easily attenuated but also has an insignificant random pattern different from normal signals. Accordingly, it is difficult to observe the high frequency power supply noise generated in the semiconductor integrated circuit using the oscilloscope connected to the outside of the semiconductor integrated circuit. Consequently, in order to facilitate the observation of the high frequency power supply noise, a technology to mount a circuit for performing observation of power supply noise on a semiconductor integrated circuit by on-chip has been proposed. See, for example, Japanese Laid-open Patent Application No. 2005-249408, and Japanese Laid-open Patent Application No. 2004-212387.

SUMMARY

According to an embodiment of the invention, a semiconductor integrated circuit includes a circuit block connected to an arithmetic processing unit via a bus, a power supply noise data generator to generate a power supply noise data signal by converting power supply noise generated in power supply voltage of power supply operates the circuit block, an error detector to detect an error of data outputted from the circuit block to the bus, and a write controller to associate power supply noise information based on the power supply noise data signal with data on the bus and to write the data in a storage unit and to stop to write the data in response to the detection of the error by the error detector.

BRIEF DESCRIPTION OF THE DRAWINGS

Embodiments are illustrated by way of example and not limited by the following figures.

DESCRIPTION OF EMBODIMENTS

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present. Like reference numerals refer to like elements throughout.

First, a configuration of the information processing apparatus is described with reference to FIGS. 1 and 2.

Figure 1:
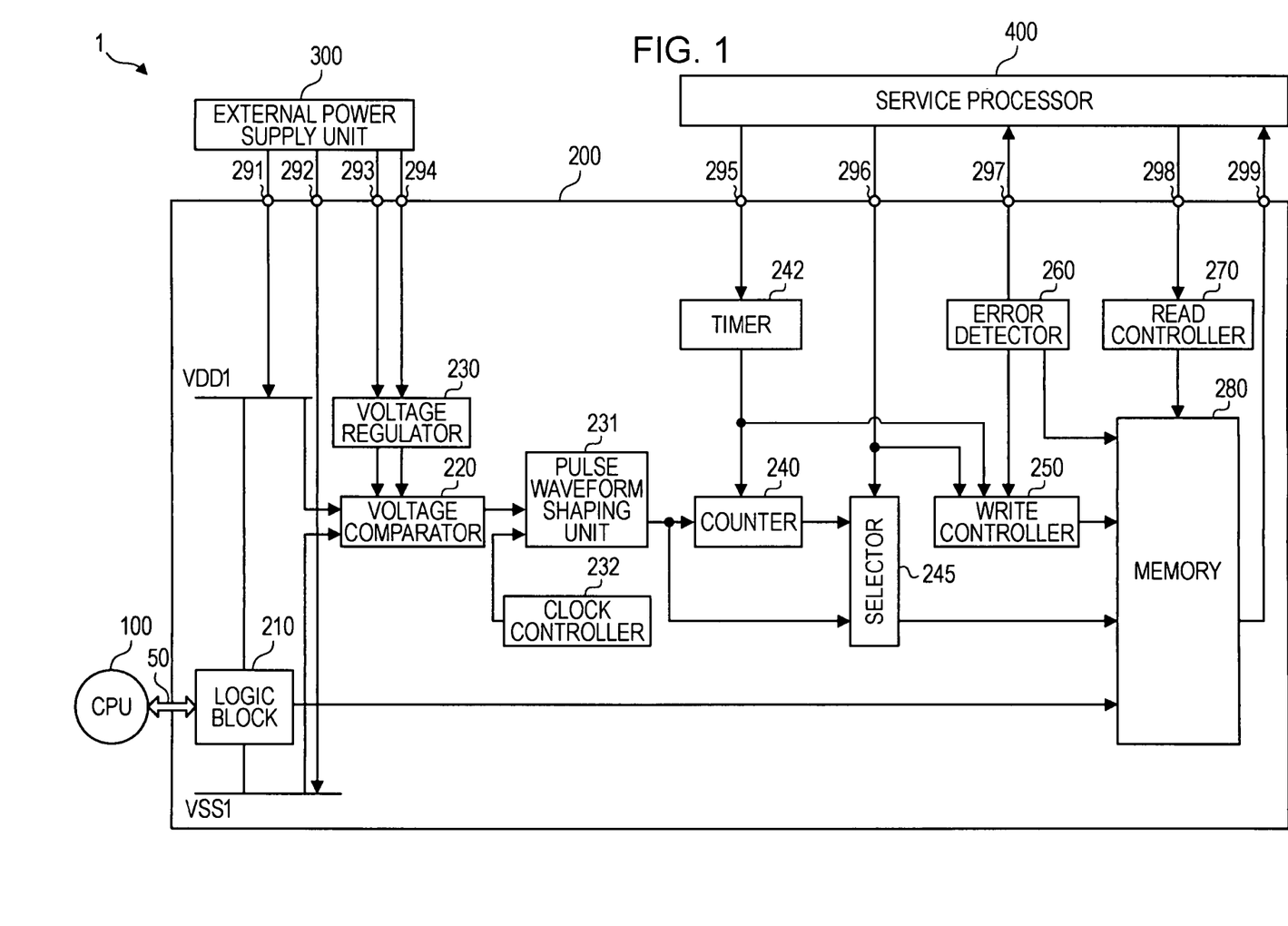
FIG. 1 is a block diagram illustrating a configuration of an information processing apparatus according to an embodiment of the present invention.

FIG. 1 is a block diagram illustrating the configuration of the information processing apparatus according to the embodiment. FIG. 2 is a block diagram illustrating an overall configuration of the information processing apparatus according to the embodiment.

Figure 2:
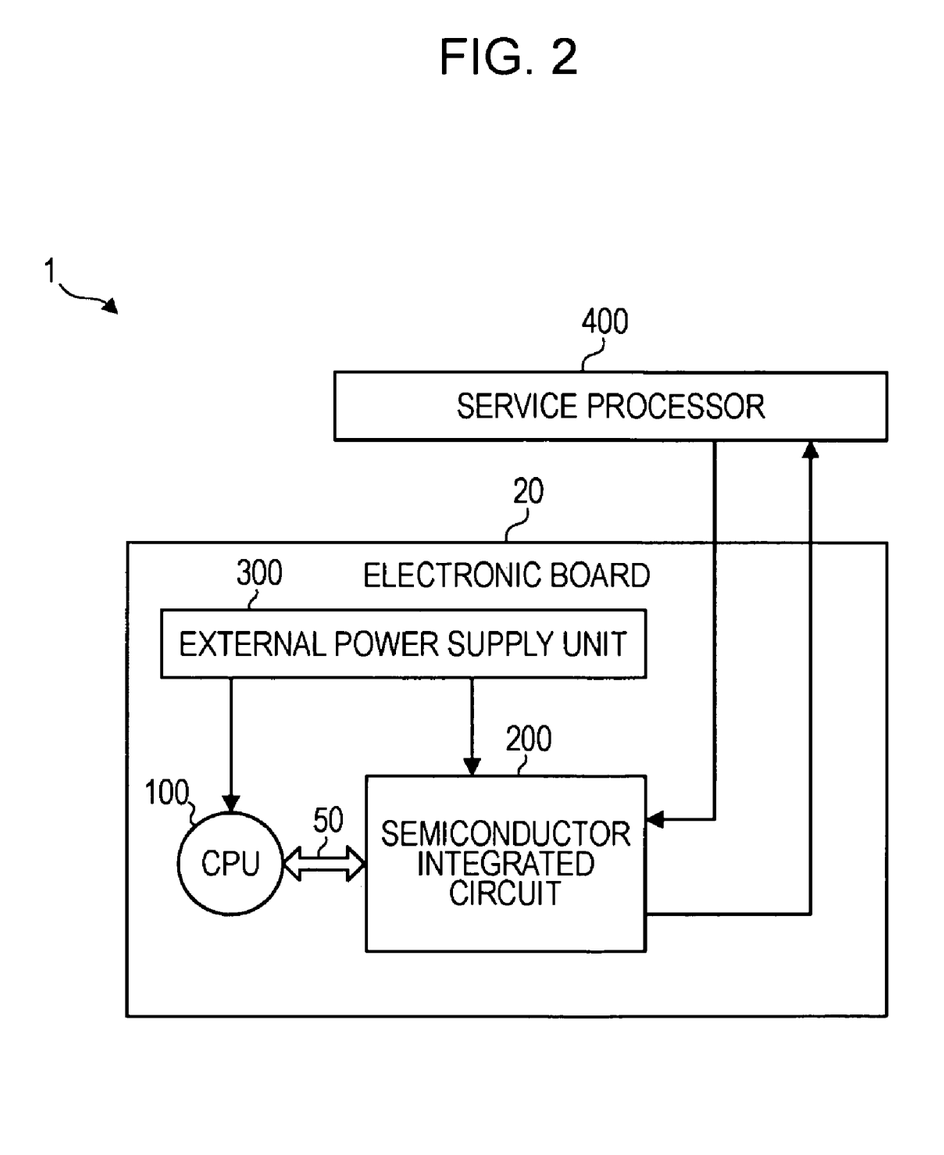
FIG. 2 is a block diagram illustrating an overall configuration of the information processing apparatus according to an embodiment.

In FIGS. 1 and 2, an information processing apparatus 1 according to the embodiment includes a CPU 100, a semiconductor integrated circuit 200 such as a chip set connected to the CPU or the like, an external power supply unit 300, and a service processor 400.

As illustrated in FIG. 2, the CPU 100, the semiconductor integrated circuit 200, and the external power supply unit 300 are mounted on an electronic board 20 such as a system board.

In FIG. 1, the CPU 100 serves as a central processing unit that is connected to a logic block 210 included in the semiconductor integrated circuit 200 via a bus 50. The CPU 100 operates at a speed, for example, more than 1 GHz. The CPU 100 performs, for example, calculation or processing on data outputted from the logic block 210 via the bus 50 and outputs the processing result to, for example, the logic block 210.

The semiconductor integrated circuit 200 includes the logic block 210, a voltage comparator 220, a voltage regulator 230, a pulse waveform shaping unit 231, a clock controller 232, a counter 240, a timer 242, a selector 245, a write controller 250, an error detector 260, a read controller 270 and a memory 280.

The logic block 210 is connected to the CPU 100 via the bus 50. The logic block 210 is a circuit block that executes processing such as arithmetic processing operations. The logic block 210 operates in response to supply from an internal power supply having a power supply potential VDD1 to a ground potential VSS1. The internal power supply having the power supply potential VDD1 and the ground potential VSS1 is supplied from the external power supply unit 300 via a power supply terminals 291 and 292 respectively. The power supply potential of the VDD1 is, for example, set to 1.0 V, and the potential is higher than the potential of the VSS1 that is set to a ground potential (GND potential) of, for example, 0V. The logic block 210 is an example of the "circuit block".

The voltage comparator 220 compares one of the power supply VDD1 and VSS1 as a target to be compared with a reference voltage Vref, and outputs power supply noise generated in the one of the power supplies as a pulse signal to the pulse waveform shaping unit 231. The voltage comparator 220 forms an example of a "power supply noise data generator" together with the voltage regulator 230, the pulse waveform shaping unit 231, and the clock controller 232.

Figure 3:
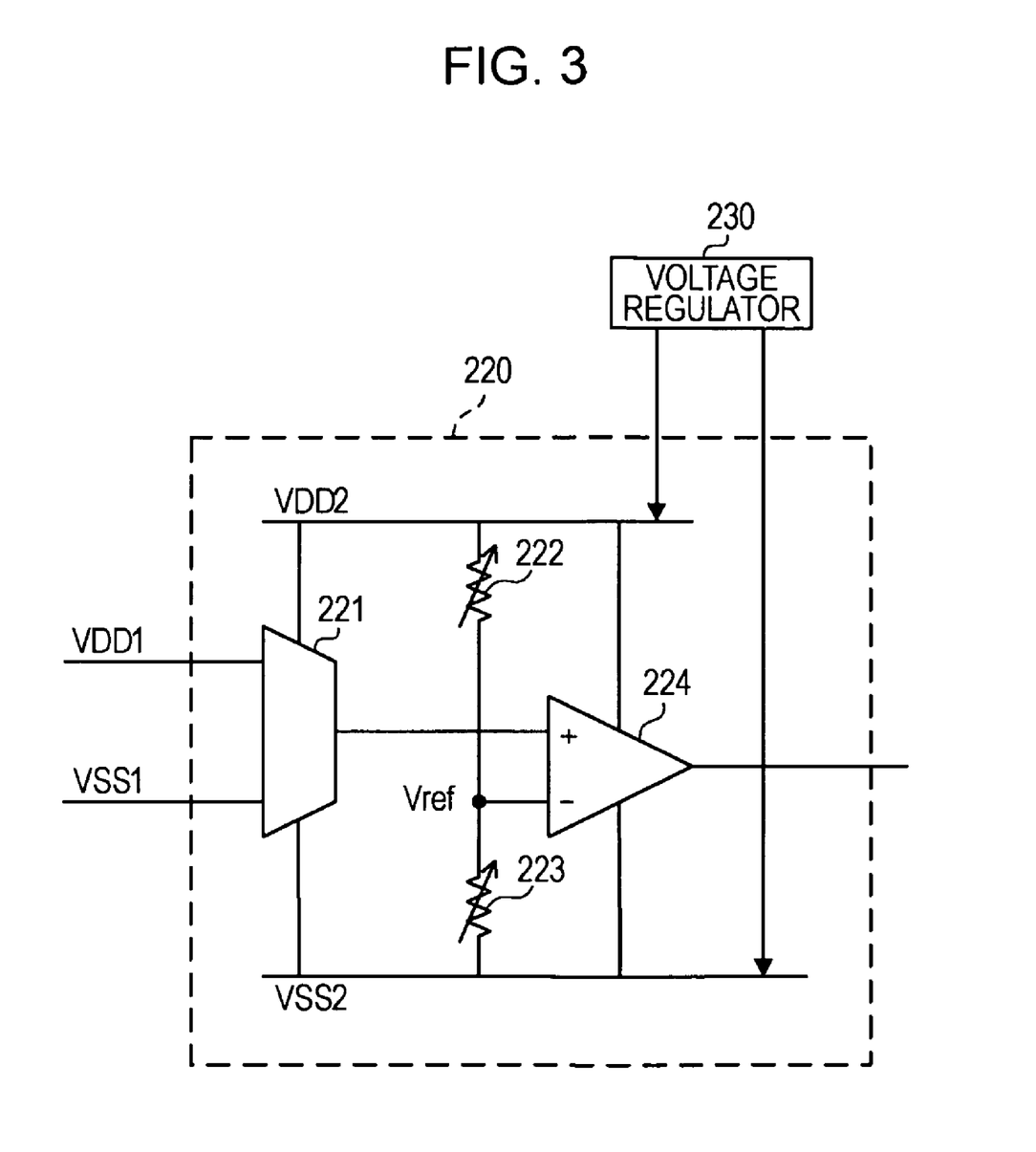
FIG. 3 is a circuit diagram illustrating a circuit configuration of a voltage comparator according to an embodiment.

FIG. 3 is a circuit diagram illustrating a circuit configuration of the voltage comparator.

In FIG. 3, the voltage comparator 220 includes a selector 221, variable resistors 222 and 223, and a differential amplifier 224.

The selector 221 selects one of the power supply VDD1 and VSS1, and outputs to one of differential inputs of the differential amplifier 224. By providing the selector 221, it is not necessary to individually provide structures for observing power supply noise for the power supply VDD1 and VSS1. Accordingly, the size of the semiconductor integrated circuit 200 may be reduced.

The variable resistors 222 and 223 may set resistance to any resistance value. The variable resistors 222 and 223 are connected in series such that power supply VDD2 and VSS2 are connected with each other and reference voltage Vref of a voltage level is generated between the VDD2 and the VSS2. The reference voltage Vref generated by the variable resistors 222 and 223 is inputted to the other differential input of the differential amplifier 224.

The selection state of the selector 221 and the resistance of the variable resistors 222 and 223 may be changed by setting a resistor for operation test from the service processor 400 (see FIG. 2), or by control via an external terminal.

The differential amplifier 224 is a circuit that outputs a pulse signal that is set to a high level when the voltage outputted from the selector 221 is higher than the reference voltage Vref and in the other cases (that is, when the voltage outputted from the selector 221 is substantially equal to the reference voltage Vref or less), set to a low level. The output of the differential amplifier 224 is used as output of the voltage comparator 220.

The power supply VDD2 and VSS2 are supplied for the each part of above described voltage comparator 220 from the external power supply unit 300 (see FIG. 1) via power supply terminals 293 and 294 respectively. Then, the voltage of the power supply VDD2 and VSS2 is stabilized by the voltage regulator 230, and supplied to the voltage comparator 220. As described above, the power supply VDD2 and VSS2 is supplied by the different power system from that of the power supply VDD1 and VSS1 that is the power supply for operating the logic block 210. Further, since the voltage of the power supply VDD2 and VSS2 is stabilized by the voltage regulator 230, the voltage comparator 220 operates accurately without being affected by noise generated by the logic block 210.

Figure 4:
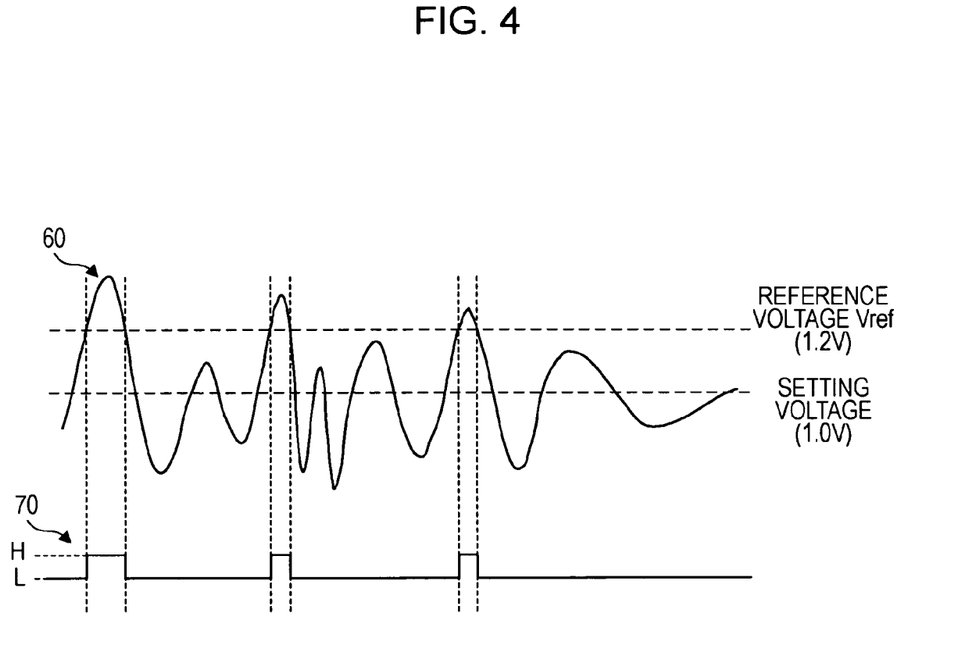
FIG. 4 is a waveform chart illustrating an example of an output waveform of the voltage comparator according to an embodiment.

FIG. 4 is a waveform chart illustrating an example of an output waveform of the voltage comparator.

FIG. 4 illustrates a waveform of a signal outputted from the voltage comparator 220 when the power supply VDD1 is inputted to the one differential input of the above-described differential amplifier 224 that is described with reference to FIG. 3.

In FIG. 4, a waveform 60 depicts variation of the voltage of the power supply VDD1. In the power supply VDD1, power supply noise is generated and the power supply VDD1 varies to setting voltage (for example, 1.0 V) that is to be original voltage. A signal 70 that is output of the voltage comparator 220 is a pulse signal that is set to a high level (H) when height of the waveform 60 (that is, the voltage of the power supply VDD1) exceeds a reference voltage Vref (for example, 1.2V). And, the signal 70 is set to a low level (L) when the height of the waveform 60 is the reference voltage Vref or less. Since the voltage comparator 220 is provided in the semiconductor integrated circuit 200, the high frequency power supply noise is inputted to the voltage comparator 220 without being attenuated, and reflected on the output of the voltage comparator 220. The magnitude of the reference voltage Vref may be changed by adjusting the resistance of the variable resistors 222 and 223 (see FIG. 3).

Returning to FIG. 1, the pulse waveform shaping unit 231 includes a latch circuit. The pulse waveform shaping unit 231 shapes the waveform of the pulse signal outputted from the voltage comparator 220 using a clock signal supplied from the clock controller 232. More specifically, the pulse waveform shaping unit 231 shapes the pulse signal outputted from the voltage comparator 220 such that the pulse rises or falls in synchronization with the clock signal and the pulse waveform shaping unit 231 outputs the shaped signal as a power supply noise data signal. As described above, using the above-described voltage comparator 220 and the pulse waveform shaping unit 231, the power supply noise generated in the power supply VDD1 and VSS1 for operating the logic block 210 and the power supply noise is converted from an analog signal to a digital signal.

The clock controller 232 is a circuit that controls the supply of the clock signal to the pulse waveform shaping unit 231. More specifically, the clock controller 232 controls supply start and supply stop of the clock signal to the pulse waveform shaping unit 231. The clock signal supplied by the clock controller 232 to the pulse waveform shaping unit 231 may be inputted from the outside of the semiconductor integrated circuit 200 via an external terminal, or may be generated in the semiconductor integrated circuit 200.

The counter 240 is a circuit that increments a held value by one every time the pulse included in the power supply noise data signal outputted from the pulse waveform shaping unit 231 is received. The counter 240 resets the held value every predetermined period (hereinafter, also referred to as "timer period") set by the timer 242. More specifically, the counter 240 set the held value to zero in response to a reset pulse supplied from the timer 242 every predetermined period. The counter 240 is a concrete example of a "counter".

The timer 242 outputs the reset pulse every predetermined timer period based on a timer setting signal supplied from the service processor 400 via an external terminal 295. The timer 242 is a concrete example of "predetermined period setting unit".

The selector 245 selects one of the power supply noise data signal outputted from the pulse waveform shaping unit 231 and the value (hereinafter, also referred to as "counted value") held by the counter 240 and outputs to the memory 280.

The write controller 250 is a circuit that controls writing of data in the memory 280. The write controller 250 includes a counter that generates a write address indicating an entry that data to be written in the memory 280. The write controller 250 performs countup of the write address in response to a selection signal supplied form the service processor 400 using the clock signal supplied from the clock controller 232. A countup period of the write address by the write controller 250 is defined by the timer period set on the basis of the reset pulse outputted from the timer 242. Further, the write controller 250 stops the writing of the data in the memory 280 by stopping countup of the write address in response to a stop signal inputted from the error detector 260 that is described below.

The error detector 260 detects data error in data outputted from the logic block 210 to the bus 50, for example, an ECC (error correcting code) error, a CRC (cyclic redundancy check) error, and a parity error. That is, the error detector 260 detects an error occurred in the data outputted from the logic block 210 to the bus 50 on the basis of an error detection code, for example, an ECC, a CRC, or a parity bit, that is attached to the data to be processed by the logic block 210. When the error is detected, the error detector 260 outputs a stop signal to the write controller 250 after a predetermined stop period has passed from the time the error was detected. Further, when the error is detected, the error detector 260 outputs an error detection pulse signal as error information indicating contents of the error to the memory 280. Further, when the error is detected, the error detector 260 notifies the service processor 400 of an interrupt signal via an external terminal 297. The predetermined stop period in the error detector 260 may be set to a certain period by the service processor 400.

The read controller 270 is a circuit that controls reading of data from the memory 280. The read controller 270 includes a counter that generates a read address indicating an entry that data to be read is stored in the memory 280. The read controller 270 performs countup of the read address on the basis of a read instruction signal inputted from the service processor 400 via an external terminal 298. The data stored in the memory 280 is read by the service processor 400 via an external terminal 299.

The memory 280 is, for example, a random access memory (RAM), to write and read data. Into the memory 280, by control of the write controller 250, the counted value or the power supply noise data signal outputted from the selector 245 is written as power supply noise information. Further, into the memory 280, data on the bus 50 is associated with the power supply noise data and written as data information. Further, when an error is detected by the error detector 260, the error information outputted from the error detector 260 is associated with power supply noise information and data information, and written into the memory 280. The memory 280 is a concrete example of "storage unit".

Figure 5:
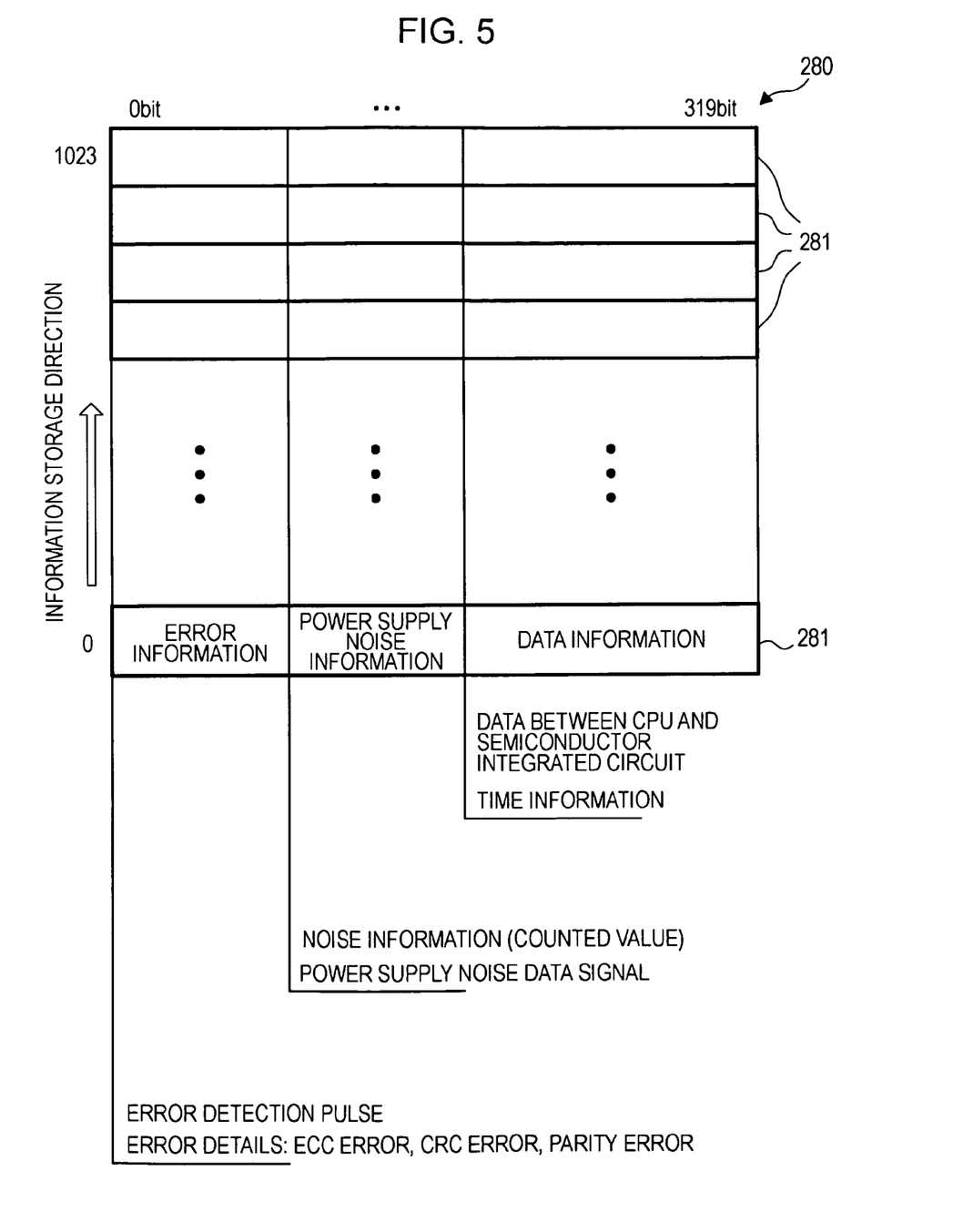
FIG. 5 is a conceptual diagram illustrating a data format of a memory according to an embodiment.

FIG. 5 is a conceptual diagram illustrating a data format of the memory.

FIG. 5 illustrates an example of the memory 280 that has a memory size of 320 bits×1024 entries. In each entry 281, for example, error information, power supply noise information, and data information is stored. Such error information, power supply noise information, and data information is stored in the memory 280 by being sequentially written from an entry 281 of the 0th to an entry 281 of the 1023rd. After the information is written in the entry 281 of the 1023rd, wrap-around is performed and the information is sequentially written again from the entry 281 of the 0th. As the error information, on the basis of the error detection pulse outputted from the error detector 260, time the error is detected or a type of the error (for example, the ECC error, the CRC error, or the parity error) is written into the memory 280. As the power supply noise information, the counted value or the power supply noise data signal outputted from the selector 245 is written into the memory 280. As the data information, the data on the bus 50 between the CPU 100 and the semiconductor integrated circuit 200 is written into the memory 280 together with the time information the error is detected.

Returning to FIG. 1, the external power supply unit 300 supplies power to the logic block 210 and the voltage comparator 220 to operate them.

The service processor 400 is generally called as SVP (service processor) that is a kind of a system control unit that controls overall operation of a system hardware. The service processor 400 associates the counted value or the power supply noise data signal outputted from the selector 245 with the data on the bus 50 and writes the data into the memory 280. Further, the service processor 400 controls the write controller 250 such that writing to the memory 280 is stopped in response to detection of an error by the error detector 260. The service processor 400 is a concrete example of "controller".

Now, operation of the information processing apparatus configured as described above at the time of inspection of a semiconductor integrated circuit is described with reference to FIG. 1 and FIG. 6 to FIG. 8.

Figure 6:
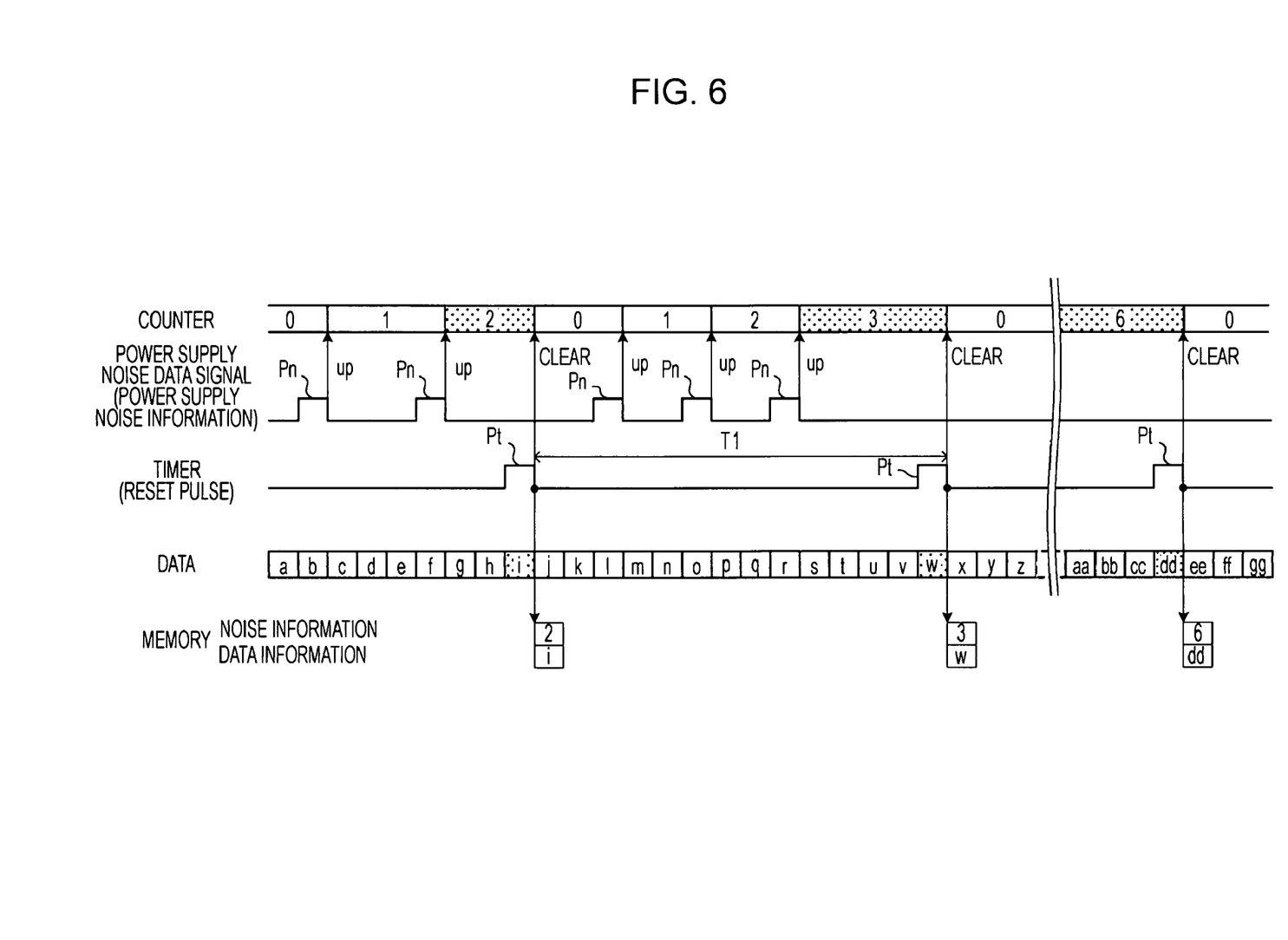
FIG. 6 is a time chart illustrating an example of operation of the information processing apparatus according to an embodiment in a case where power supply noise information and data information is written in a memory every timer period.

FIG. 6 is a time chart illustrating an example of the operation of the information processing apparatus in a case where power supply noise information and data information is written in the memory every timer period.

FIG. 6 illustrates a case where the write controller 250 performs countup of a write address every timer period T1. That is, FIG. 6 illustrates counted values of the counter 240, power supply noise data signals outputted from the pulse waveform shaping unit 231, reset pulses outputted from the timer 242, data on the bus 50, and noise amounts and data information written in the memory 280 in chronological order. In the description below, a case where power supply noise generated in the power supply VDD1 is observed is described as an example. More specifically, a case where the power supply VDD1 is inputted in one differential input of the above described differential amplifier 224 is described as an example with reference to FIG. 3. If power supply noise generated in the power supply VSS1 is to be observed, it is similar to the case described below.

In FIG. 1, a pulse signal indicating power supply noise being generated in the power supply VDD1 supplied to the logic block 210 is inputted to the pulse waveform shaping unit 231 from the voltage comparator 220. As described above with reference to FIGS. 3 and 4, the pulse signal is generated by comparing the power supply VDD1 with the reference voltage Vref by the voltage comparator 220.

Then, the waveform of the pulse signal inputted from the voltage comparator 220 to the pulse waveform shaping unit 231 is shaped using the clock signal supplied from the clock controller 232 by the pulse waveform shaping unit 231. The waveform shaped pulse signal is inputted as a power supply noise data signal from the pulse waveform shaping unit 231 to the counter 240.

In FIGS. 1 and 6, the counter 240 performs countup by incrementing the counted value by one every pulse Pn included in the power supply noise data signal. The counter 240 resets or clears the counted value in response to the reset pulse Pt inputted every timer period T1 from the timer 242. That is, the counter 240 resets the counted value every timer period T1. In the example illustrated in FIG. 6, the counter 240 counts the counted value up from zero to two every timing the pulse Pn is inputted, and resets the counted value to zero in response to the reset pulse Pt. Then, the counter 240 counts the counted value up from zero to three every timing the pulse Pn is inputted, and resets the counted value to zero in response to the reset pulse Pt. As described above with reference to FIG. 4, the pulse Pn included in the power supply noise data signal corresponds to the power supply noise exceeding the reference voltage Vref, and accordingly, may be referred to as a noise pulse.

In the operation example, the counted value is written in the memory 280 by the write controller 250 as the noise information every timer period T1, and the data on the bus 50 is associated with occurrence of the noise of the voltage exceeding the reference voltage Vref and written in the memory 280. That is, when the reset pulse Pt is inputted in the write controller 250 from the timer 242, the counted value and the data on the bus 50 are written in the entry 281 (see FIG. 5) on the memory 280 by the write controller 250. The noise information is written in the memory 280 as a part of the power supply noise information, and the data on the bus 50 is written in the memory 280 as a part of the data information. In the example illustrated in FIG. 6, a counted value "2" and data "i" on the bus 50 at the timing the reset pulse Pt is written in the write controller 250 are written in the entry 281 on the memory 280. And, in the timer period T1 from the reset pulse Pt, a counted value "3" and data "w" on the bus 50 at the timing the next reset pulse Pt is written in the write controller 250 are written in the entry 281 on the memory 280. More specifically, the counted value "3" and the data "w" on the bus 50 are written in the entry 281 that is counted up from the entry 281 where the counted value "2" and the data "i" on the bus 50 has been written respectively. Further, a counted value "6" and data "dd" on the bus 50 at a timing the other reset pulse Pt is inputted in the write controller 250 are written in the same entry 281. In FIG. 6, the data on the bus 50 is depicted as "a", "b", "c", ..., "z", ..., "aa", ..., "gg" in chronological order.

As described above, when the power supply noise is observed, in the information processing apparatus 1, the noise information of the power supply noise of the voltage exceeding the reference voltage Vref and the data on the bus 50 is associated with each other and written in the memory 280 in the semiconductor integrated circuit 200. In the operation example, specifically, the noise information and the data on the bus 50 are written in the memory 280 every timer period T1.

Figure 7:
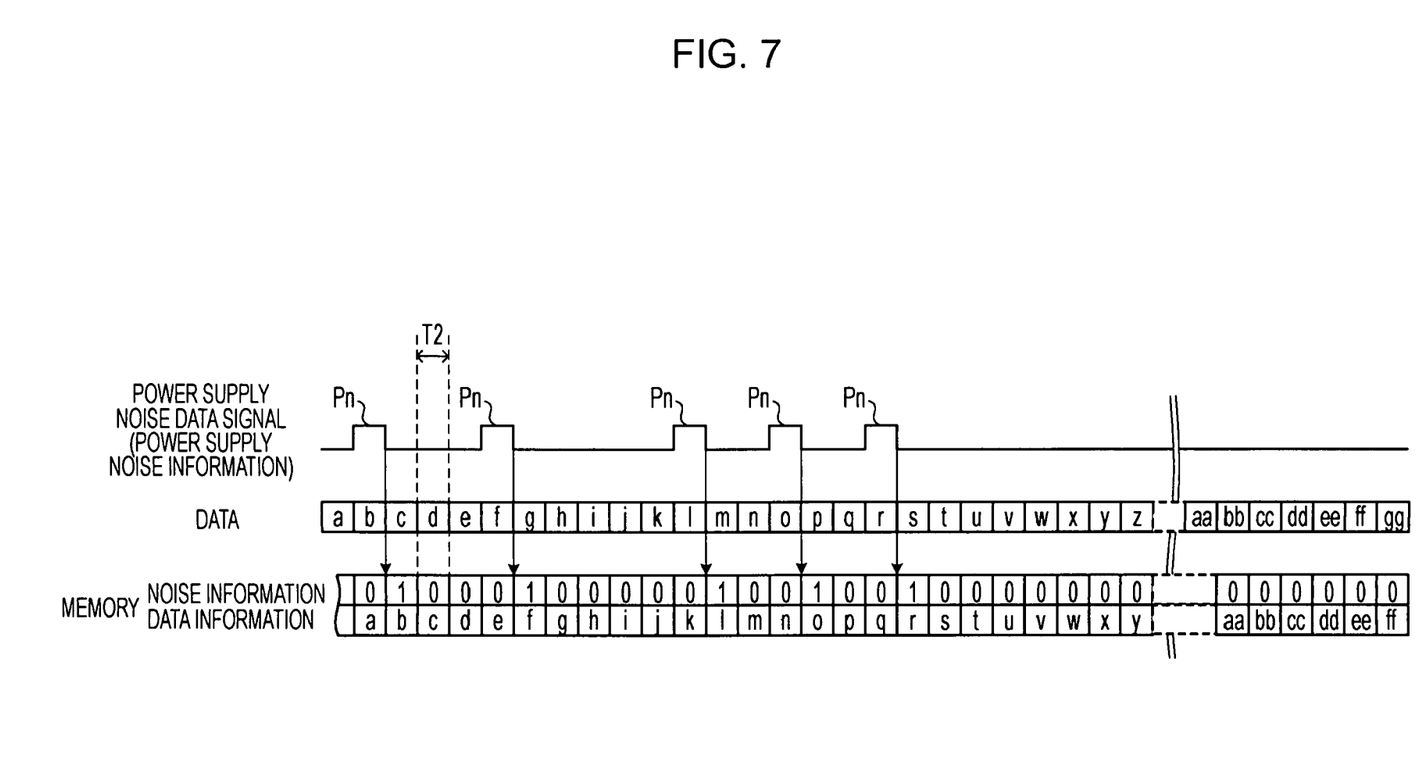
FIG. 7 is a time chart illustrating an example of operation of the information processing apparatus according to an embodiment in a case where power supply noise information and data information is written in a memory every clock cycle period.

FIG. 7 is a time chart illustrating an example of operation of the information processing apparatus in a case where power supply noise information and data information is written in the memory every clock cycle period.

FIG. 7 illustrates power supply noise data signals outputted from the pulse waveform shaping unit 231, data on the bus 50, and noise information and data information written in the memory 280 in chronological order in a case where the write controller 250 performs countup of a write address every clock cycle period T2. In the following description, points different from those in the above described operation example described with reference to FIG. 6 that the noise information and the data on the bus 50 is written in the memory 280 every timer period T1 will be described in detail. Descriptions of points similar to those in the above described operation example described with reference to FIG. 6 are omitted.

In FIGS. 1 and 7, the write controller 250 writes power supply noise data signal outputted from the pulse waveform shaping unit 231 every clock cycle period T2 as noise information into the memory 280, and associates data on the bus 50 with the noise information and writes the data into the memory 280. More specifically, corresponding to a period a pulse Pn, indicating that power supply noise of voltage exceeding the reference voltage Vref is generated, is included in the power supply noise data signal. On the one hand, "1" is written as the noise information, and corresponding to a period the pulse Pn is not included in the power supply noise data signal. On the other hand, "0" is written as the noise information in the memory 280 every clock cycle period T2. That is, depending on the existence of the pulse Pn, the power supply noise data signal is converted into "0" or "1" every clock cycle period T2 and written in the memory 280 as the noise information. Further, the data on the bus 50 is written in the memory 280 every clock cycle period T2. In the example illustrated in FIG. 7, the data "a", "b", "c", ..., "z", ..., "aa", ..., "ff" on the bus 50 is sequentially written in the memory 280 every clock cycle period T2. When the data "a" on the bus 50 is written in the memory 280, the pulse Pn is not included in the power supply noise data signal. Accordingly, in the entry 281 (see FIG. 5) in which the data "a" is written, "0" is written as the noise information. When the subsequent data "b" on the bus 50 is written in the memory 280, the pulse Pn is included in the power supply noise data signal. Accordingly, in the entry 281 in which the data "b" is written, "1" is written as the noise information. In a similar manner, when the data on the bus 50 is written in the memory 280, depending on whether the pulse Pn is included in the power supply noise data signal or not, in the entry 281 in which the data on the bus 50 is written, "1" or "0" is written as the noise information.

As described above, in the operation example in FIG. 7, similarly to the operation example described above with reference to FIG. 6, in the memory 280, the noise information of the power supply noise is associated with the data on the bus 50 and written. In the operation example, specifically, the noise information and the data on the bus 50 is written in the memory 280 every clock cycle period T2.

Figure 8:
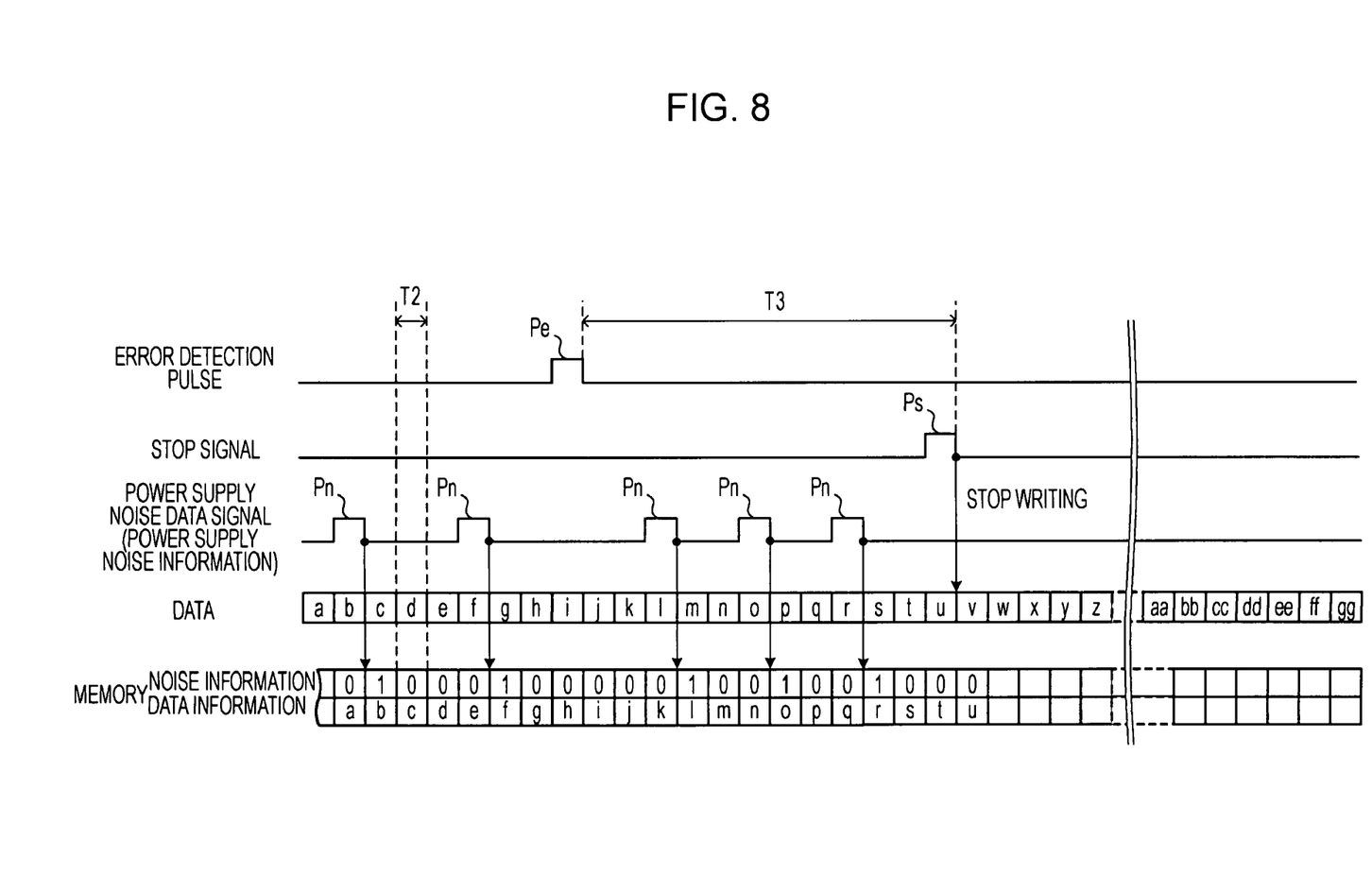
FIG. 8 is a time chart illustrating operation of the information processing apparatus according to an embodiment in a case where an error is detected.

FIG. 8 is a time chart illustrating operation of the information processing apparatus in a case where an error is detected.

FIG. 8 illustrates operation of the error detector 260 when the write controller 250 performs countup of a write address every clock cycle period T2. More specifically, FIG. 8 illustrates an error detection pulse and a stop signal outputted from the error detector 260, a power supply noise data signal outputted from the pulse waveform shaping unit 231, data on the bus 50, and noise information and data information written in the memory 280 in chronological order.

In FIGS. 1 and 8, when the error detector 260 detects an error in data outputted from the logic block 210 to the bus 50, the error detector 260 outputs an error detection pulse Pe to the memory 280. Then, by the write controller 250, the error detection pulse Pe is written in the memory 280 as error information. That is, on the basis of the error detection pulse Pe, the error information such as the time the error is detected and the type of the error is written in the same entry 281 (see FIG. 5) in the memory 280 together with the noise information and the data on the bus 50. Further, the error detector 260 outputs a stop signal Ps to the write controller 250 after a stop period T3 has passed from the output of the error detection pulse Pe after the error was detected. In response to the input of the stop signal Ps, the write controller 250 stops the writing of the noise information of the power supply noise and the data on the bus 50 in the memory 280. In the example illustrated in FIG. 8, the noise information "0" and the data "u" at the timing the stop signal Ps is inputted in the write controller 250 is written in the same entry 281 in the memory 280. Then, the writing of the noise information and the data on the bus 50 into the memory 280 is stopped. Accordingly, subsequent data "v", "w", . . . , "gg" and the like is not written in the memory 280.

Accordingly, it is possible to store the noise information and the data on the bus 50 in the period including the timing the error is detected by the error detector 260 into the memory 280. Further, the noise information and the data on the bus 50 are read from the memory 280 into the service processor 400 by the read controller 270. Accordingly, it is possible to analyze the noise information of the power supply noise, the data on the bus 50, and the correlation between the noise information and the data on the bus in the period including the time the error occurred in the data outputted from the logic block 210 to the bus 50. That is, it is possible to analyze the data pattern and the power supply noise at the data error occurrence when the data error occurred in the data outputted from the logic block 210 to the CPU 100 via the bus 50. Further, it is also possible to analyze the correlation between the data pattern and the power supply noise at the data error occurrence. For example, it is possible to understand at which degree of the frequency of occurrence of the power supply noise of the voltage exceeding the reference voltage Vref the data error occurs, or by which combination of the occurrence of the power supply noise of the voltage exceeding the reference voltage Vref and the data pattern, the data error occurs. In addition, for example, when power supply noise is not detected at data error occurrence, it is possible to determine the cause of the data error that the data error occurrence is not caused by the power supply noise.

In the above description, an example of the operation of the information processing apparatus 1 has been described in which when the write controller 250 performs countup of a write address every clock cycle period T2, an error is detected. Similarly, when the write controller 250 that has been described with reference to FIG. 6 performs the countup of a write address every timer period T1, by the write controller 250, the error detection pulse Pe is written in the memory 280 as the error information. Further, with the writing of the error information, after the predetermined stop period has passed from the time the error was detected by the error detector 260, in response to the stop signal Ps, the writing of the noise information and the data on the bus 50 into the memory 280 is stopped.

Now, an error detection method and a method of measuring power supply noise in a semiconductor integrated circuit according to a comparative example will be described with reference to FIGS. 9A and 9B.

Figure 9A:
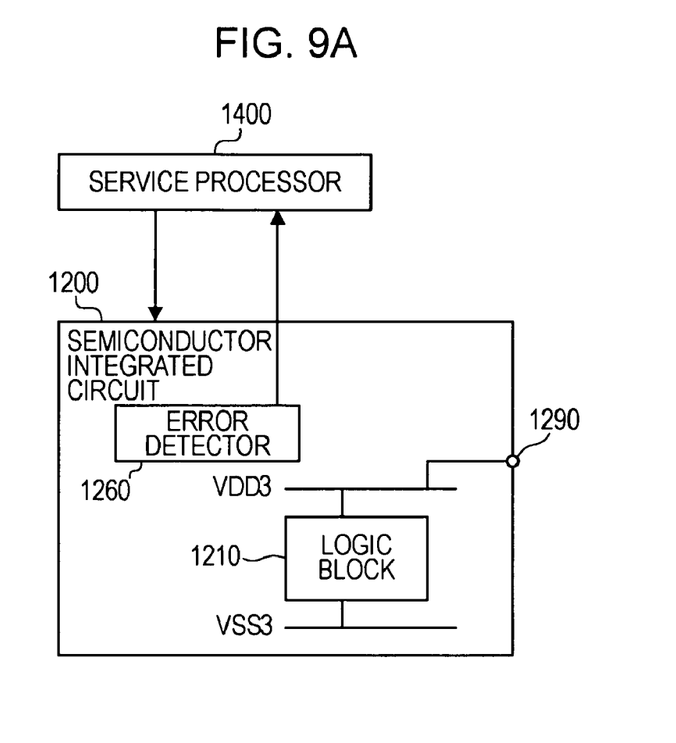
FIGS. 9A and 9B are block diagrams illustrating an error detection method and a method of measuring power supply noise in a semiconductor integrated circuit according to a comparative example.
Figure 9B:
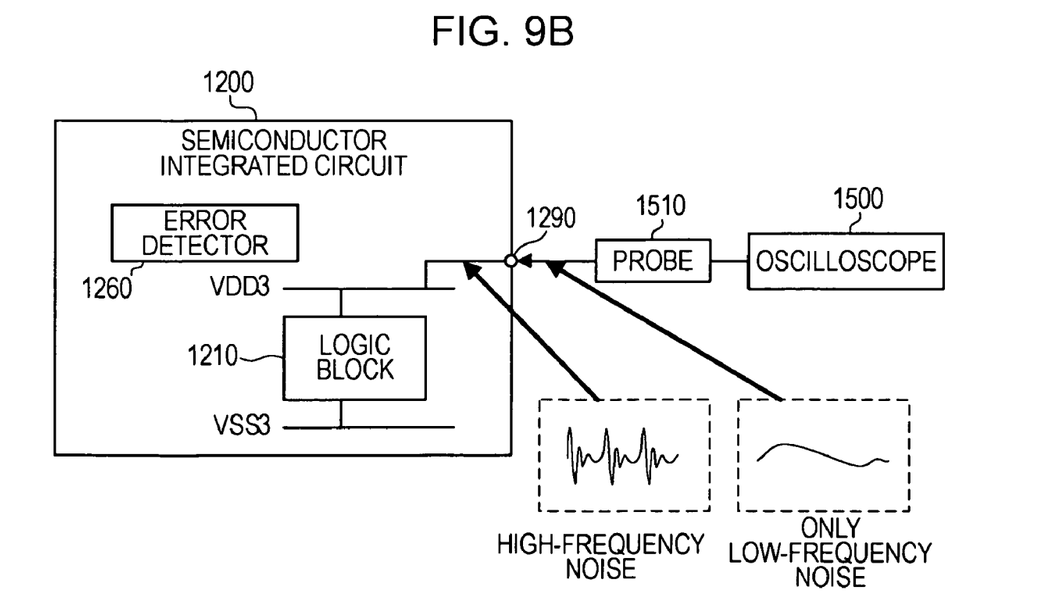

FIGS. 9A and 9B are block diagrams illustrating an error detection method and a method of measuring power supply noise in a semiconductor integrated circuit according to the comparative example. FIG. 9A illustrates the error detection method in the semiconductor integrated circuit according to the comparative example. FIG. 9B illustrates the method of measuring power supply noise in the semiconductor integrated circuit according to the comparative example.

In FIG. 9A, a semiconductor integrated circuit 1200 according to the comparative example includes a logic block 1210 and an error detector 1260. The logic block 1210 is connected to a CPU (not depicted) via a bus. The logic block 1210 is a circuit block that executes processing such as arithmetic processing. The logic block 1210 operates in response to reception of supply of a pair of power sources of power supply VDD3 and VSS3 from an external power supply unit (not depicted). The error detector 1260 detects a data error, for example, an ECC error, a CRC error, and a parity error in the logic block 1210. The error detector 1260 detects an error and notifies a service processor 1400 of an interrupt signal. As described above, the error detection in the semiconductor integrated circuit 1200 is performed by notifying the service processor 1400 of the interrupt signal by the error detector 1260.

Meanwhile, as illustrated in FIG. 9B, the measurement of power supply noise of the power supply VDD3 in the semiconductor integrated circuit 1200 according to the comparative example is performed using an oscilloscope 1500 that is connected to an external terminal 1290 for power supply noise observation via a probe 1510. In the measurement method, on the way the power supply noise is drawn from the inside of the semiconductor integrated circuit 1200 to the probe 1510 via the external terminal 1290, high frequency components of the power supply noise are attenuated. Accordingly, most of the components observed are low-frequency components of the power supply noise. Further, in the measurement method, wiring for drawing the power supply VDD3 is an antenna, and the antenna may be affected by the other noise.

Further, as in the above described comparative example, in the case where after the error detection is performed, the error detection and the measurement of the power supply noise is separately performed by measuring the power supply noise by connecting the oscilloscope 1500 to the semiconductor integrated circuit 1200, it is not possible to observe power supply noise at the moment the error is detected. Accordingly, it is difficult to analyze correlation between the error and the power supply noise.

However, as described with reference to FIGS. 1 to 8, the power supply noise data signal is generated by the voltage comparator 220 and the voltage regulator 230 provided in the semiconductor integrated circuit 200. Accordingly, on the generated power supply noise data signal, the high frequency power supply noise is reflected without being attenuated, and the power supply noise including the high frequency components are observed.

Further, the power supply noise information based on the power supply noise data signal is associated with the data information on the bus 50 and written into the memory 280. Then, after the stop period T3 has passed from the timing the error detector 260 detected the error, the writing into the memory 280 is stopped. Accordingly, it is possible to store the noise amount and the data on the bus 50 in the period around the timing the error was detected by the error detector 260 into the memory 280. Accordingly, it is possible to analyze the data pattern, the power supply noise and the power supply noise, and the correlation between the data pattern at the data error occurrence.

As described above, it is possible to analyze the data pattern, the power supply noise, and the correlation between the data pattern and the power supply noise at the data error occurrence.

It is to be understood that the invention is not limited to the above-described embodiment(s), and various modifications may be employed without departing from the spirit and scope of the invention as set forth in the claims and described in the present disclosure. Such modified semiconductor integrated circuit, a method for controlling the circuit, and modified information processing apparatus are included in the technical scope of the present invention.

What is claimed is:

1. A semiconductor integrated circuit comprising:
    a circuit block connected to an arithmetic processing unit via a bus;
    a power supply noise data generator to generate a power supply noise data signal by converting power supply noise generated in power supply voltage of power supply operates the circuit block;
    an error detector to detect an error of data outputted from the circuit block to the bus; and
    a write controller to associate power supply noise information based on the power supply noise data signal with data on the bus and write the data in a storage unit, and to stop to write the data in response to the detection of the error by the error detector.

2. The semiconductor integrated circuit according to claim 1, wherein the power supply noise data generator includes a voltage comparator which is configured to compare the power supply voltage with reference voltage and to generate a comparison signal once the power supply voltage is higher than the reference voltage; and
    a pulse waveform shaping unit which is configured to shape the comparison signal to a pulse waveform on the basis of a clock signal, and generates the power supply noise data signal,
    the semiconductor integrated circuit further comprising a counter which is configured to count the number of pulse waveforms included in the power supply noise data signal every predetermined period, and
    the write controller to associate the count value of the counter with the data on the bus in the predetermined period as the power supply noise information and write the data in the storage unit.

3. The semiconductor integrated circuit according to claim 1, wherein the error detector to output error information indicating contents of the error once the error is detected;
    the write controller to associate the error information with the power supply noise information and the data on the bus and write the data in the storage unit once the error detector detects the error, and after the predetermined period has passed from the detection of the error, to stop the writing of the power supply noise information, the data on the bus, and the error information in the storage unit.

4. The semiconductor integrated circuit according to claim 2, further comprising a predetermined period setting unit to set the predetermined period.

5. The semiconductor integrated circuit according to claim 2, wherein the predetermined period is substantially the same as the cycle of the clock signal.

6. An information processing apparatus comprising:
    an arithmetic processing unit;
    a semiconductor integrated circuit that includes,
        a circuit block connected to the arithmetic processing unit via a bus,
        a power supply noise data generator to generate a power supply noise data signal by converting power supply noise generated in power supply voltage of power supply which operates the circuit block,
        an error detector to detect an error of data outputted from the circuit block to the bus,
        a storage unit to store data, and
        a write controller to control the writing of the data in the storage unit; and
    a system controller to control the write controller such that the write controller is configured to associate power supply noise information based on the power supply noise data signal with data on the bus and write the data in the storage unit, and to stop to write the data in the storage unit in response to the detection of the error by the error detector.

7. The information processing apparatus according to claim 6, wherein the semiconductor integrated circuit includes a voltage comparator configured to compare the power supply voltage with reference voltage and to generate a comparison signal once the power supply voltage is higher than the reference voltage;
    a pulse waveform shaping unit configured to shape the comparison signal to a pulse waveform on the basis of a clock signal, and generates the power supply noise data signal; and
    a counter configured to count the number of pulse waveforms included in the power supply noise data signal every predetermined period, and
    the system controller configured to control the write controller such that the write controller associates the count value of the counter with the data on the bus in the predetermined period as the power supply noise information and writes the data in the storage unit.

8. The information processing apparatus according to claim 6, wherein the error detector is configured to output error information indicating contents of an error once the error is detected and outputs an interruption signal to the system controller; and
    the system controller is configured to control the write controller such that the write controller associates the error information with the power supply noise information and the data on the bus and writes the data in the storage unit once the interruption signal is inputted from the error detector, and after the predetermined period has passed from the detection of the error, stops to write the power supply noise information, the data on the bus, and the error information in the storage unit.

9. A method of controlling a semiconductor integrated circuit having a circuit block connected to an arithmetic processing unit via a bus and a storage unit which stores data, the method comprising:
    generating a power supply noise data signal by converting power supply noise generated in power supply voltage of power supply which operates the circuit block;
    detecting an error of data outputted from the circuit block to the bus;
    associating power supply noise information based on the power supply noise data signal with data on the bus;
    writing the data in the storage unit; and
    stopping to write the data in the storage unit in response to the detection of the error.

10. The method of controlling the semiconductor integrated circuit according to claim 9, wherein in the detecting the error of the data outputted from the circuit block to the bus, once the error is detected, outputting error information indicating contents of the error, and
    in the stopping to write the data in the storage unit, once the error is detected in the detecting the error of the data outputted from the circuit block to the bus, associating the error information with the power supply noise information and the data on the bus and writing the data in the storage unit, and after the predetermined period has passed from the detection of the error, stopping the writing of the power supply noise information, the data on the bus, and the error information in the storage unit.

* * * * *